United States Patent [19]

Szmanda et al.

[11] Patent Number: 5,443,736
[45] Date of Patent: Aug. 22, 1995

[54] PURIFICATION PROCESS

[75] Inventors: Charles R. Szmanda, Westborough; Richard J. Carey, Sherborn, both of Mass.

[73] Assignee: Shipley Company Inc., Marlborough, Mass.

[21] Appl. No.: 139,923

[22] Filed: Oct. 20, 1993

[51] Int. Cl.⁶ .............................................. B01D 15/00
[52] U.S. Cl. .................................... 210/668; 210/688
[58] Field of Search ............... 210/668, 684, 688, 694, 210/669

[56] References Cited

U.S. PATENT DOCUMENTS

| | | | |
|---|---|---|---|
| 5,073,622 | 12/1991 | Wojtech et al. | 528/486 |
| 5,087,370 | 2/1992 | Schultheis et al. | 210/684 |
| 5,234,789 | 8/1993 | Favier, Jr. et al. | 430/165 |
| 5,320,756 | 6/1994 | Winston | 210/669 |

FOREIGN PATENT DOCUMENTS

93/12152  6/1993  WIPO .

*Primary Examiner*—Ivars Cintins
*Attorney, Agent, or Firm*—Robert L. Goldberg

[57] ABSTRACT

The invention is for a process of removing organic contaminants and multivalent metal ions from solution. The process comprises chelating multivalent metal ions in an organic solution to be purified and contacting the solution with activated carbon. The process is especially useful for removal of multivalent metal ions from a solution of photoresist components.

20 Claims, No Drawings 5,443,736

PURIFICATION PROCESS

BACKGROUND OF THE INVENTION

1. Introduction

This invention relates to removal of contaminants from organic compositions. More particularly, this invention relates to removal of multivalent metal ions and organic contaminants from photoresist compositions.

2. Description of the Prior Art

Photoresists are light-sensitive compositions used for the formation of images in the manufacture of electronic devices. Photoresist coating compositions typically comprise a light-sensitive component and a polymer binder dissolved in a solvent. Typical photoresist compositions are disclosed in U.S. Pat. Nos. 5,178,986; 5,212,046; 5,216,111; and 5,238,776, each incorporated by reference for disclosure of photoresist compositions, processing, and use.

In the manufacture of high resolution integrated circuits, it is known that many processing liquids come into contact with a bare wafer or a resist coated surface. These include the resist itself and treatment chemicals such as organic liquids and aqueous solutions which contain acids, bases, oxidants, and other proprietary ingredients. At least 15 to 50 liquids of various compositions are used to clean wafers, prime surfaces, deposit resists or other polymers, develop, rinse, etch, and strip the resist. It is known that these solutions are the source of contaminants that can interfere with the performance of the integrated circuit. Thus, the reduction or removal of insoluble and soluble contaminants from processing fluids used for the production of integrated circuits before or during use is basic insurance for prevention of damage to the integrated circuit.

Photoresist liquids are known to contain particulate and ionic contaminants. For example, it is known that solid gels or insolubles form in photoresists due to dark reactions. In addition, soluble impurities such as moisture, silicone oils, plasticizers, and metal ions may be present from the manufacture of the resist components and from the packaging containers or dispensing tanks. Trapped bubbles from point-of-use filtration or the shaking of a resist bottle prior to dispensing can lead to defects in resist coatings. In Class 100 clean rooms, airborne particulate counts amount to 3 particles per liter of density of 2. By comparison, liquids contain about 100,000 particles per liter. A particle count of 100,000 per liter seems high, but if translated into a solid of $0.6\mu$ in size (entity of 2), this is equivalent to 10 parts per million (ppm). A level of 10 ppm amounts to the deposition of 1 mg per liter. Since liquids are heavily contaminated compared to clean room air, effective contaminant removal is essential to the manufacture of such devices.

Ultrafiltration of resist liquids has progressed and manufacturers of resist now supply resist materials filtered through 0.04 $\mu$M-diameter absolute filters. Other methods for removal of particulates such as gels include ultracentrifugation, electrostatic treatment of the resist, and depth filtration. These methods are useful for the removal of particulates but are not effective in removing dissolved contaminants such as organic impurities and ionic species. These contaminants can be as damaging to an integrated circuit as particulate contamination.

Dissolved contaminants in resists such as metal ions, organic contaminants and halide ions require more sophisticated detection and removal methods than the methods used to remove particulates. One such method is disclosed in International Publication No. WO 93/12152 which is directed to removing metal ions such as sodium and iron from novolak resins during manufacture. The process comprises cation exchange treatment whereby a cation exchange resin is first washed with a mineral acid solution to reduce the level of total sodium and iron ions within the exchange resin to preferably less than 100 ppb, passing a formaldehyde reactant through the so treated cation exchange resin to decrease the sodium and iron ion content to less than 40 ppb, passing a phenolic compound through the cation exchange resin to decrease its sodium and iron ion content to less than 30 ppb, and then condensing the so treated phenolic compound with formaldehyde in the presence of an acid catalyst to form the resin. This method of removal is cumbersome, does not remove contaminants from other photoresist components and does not remove the ionic species from the photoresist that enters between the time of manufacture of the phenolic and the use of the photoresist.

Another process for removing metal ions from photoresist compositions comprises treating an ethyl lactate solvent with a cation exchange resin at elevated temperatures. This process is disclosed in U.S. Pat. No. 5,234,789, incorporated herein by reference. It is stated in the patent that the purification of the ethyl lactate solvent at elevated temperature in the presence of the cation exchange resin results in transesterification and saponification with the formation of a lactide and other by-products. In accordance with said patent, the presence of the lactide in the photoresist composition is said to be advantageous as the lactide is said to function as a lithographic speed enhancer. However, in practice, it has been found that the presence of the lactide makes the photospeed unpredictable and the process does not remove multivalent metal ions because the multivalent ions are often chelated with other impurities in the solution.

An additional process for removing metal ions from novolak resins is disclosed in U.S. Pat. No. 5,073,622, incorporated herein by reference. In accordance with this patent, a conventional novolak resin is dissolved in an organic solvent or solvent mixture in a concentration of from about 25 to 50 percent by weight and the resultant solution is contacted at least once with an acidic, preferably complex forming, compound. The contacting step is preferably performed by carrying out a liquid-liquid extraction which may include a single-stage or multi-stage crossflow or multi-stage countercurrent treatment. In accordance with the patent, metal ions contained in the novolak resin are complexed and extracted into an aqueous phase upon contact of the organic and aqueous phases with each other.

SUMMARY OF THE INVENTION

In accordance with the invention, it has been unexpectedly found that multivalent metal ion contaminants in an organic solution such as a photoresist together with organic contaminants can be simultaneously reduced to acceptably low levels if the metal ions are first chelated to form a soluble complex and then contacted with high purity activated carbon to extract the solubilized ion and the organic impurities.

In a preferred embodiment of the invention, multivalent metal ions are removed from a photoresist having an o-quinone diazide ester photoactive compound. It is known that such photoactive compounds contain azo and diazo dye impurities as consequence Of the method by which the photoactive compounds are manufactured. It is also known that azo and diazo compounds are strong chelating agents for multivalent ions. Accordingly, in accordance with this preferred embodiment of the invention, a solution of a photoresist composition, or components of a photoresist composition, containing an o-quinone diazide ester as a photoactive compound is prepared. The dye impurities in contact with the multivalent ions chelate with the same. The photoresist is then contacted with a high purity, finely divided carbon whereby organic impurities together with the chelated multivalent ions are absorbed by the activated carbon.

In the most preferred embodiment of the invention, the solution of photoresist components containing chelated multivalent metal ions is contacted with an activated carbon that is the product resulting from pyrolysis of certain cation exchange resins. Pyrolysis of the cation exchange resin is believed to result in formation of an activated carbon having retained cation exchange groups. Using an activated carbon having retained cation exchange groups permits removal of organic impurities while taking advantage of the cation exchange groups to assist in the removal of metal ions.

The results obtained in accordance with the process of the invention are unexpected in that it was not anticipated that chelation of the multivalent ions with other impurities would enhance removal by activated carbon, and it was unexpected that activated carbon would display an extremely high selectivity for the chelated impurities as compared to the other components in the photoresist composition.

DESCRIPTION OF THE PREFERRED EMBODIMENTS

The process of the invention is applicable to any organic solution containing multivalent metal ion contamination but is especially useful for treating photoresist compositions containing multivalent metal ion contaminants. Accordingly, the description that follows will exemplify photoresist purification procedures, but the invention should not be construed as limited to this embodiment.

Photoresists are well known and described in numerous publications including DeForest, *Photoresist Materials and Processes*, McGraw-Hill Book Company, New York, Chapter 2, 1975 and Moreau, *Semiconductor Lithography, Principles, Practices and Materials*, Plenum Press, New York, Chapters 2 and 4, 1988, incorporated herein by reference.

Suitable positive-working photoresists typically contain two components—a light-sensitive compound and a film-forming polymeric binder where the light-sensitive component undergoes photochemical alteration upon exposure. Single component systems are known and typically comprise a polymer that undergoes chain scission upon exposure. The light-sensitive compounds most frequently used in two-component resist systems are esters and amides formed from o-quinone diazide sulfonic and carboxylic acids, especially from sulfonic acid esters of naphthoquinone diazides. These esters and amides are well known and described by DeForest, supra, pages 47–55 and by Moreau, supra, pages 34–52. The light-sensitive compounds and the methods used to make the same are all documented in prior patents including U.S. Pat. Nos. 3,046,110; 3,046,112; 3,046,119; 3,046,121; 3,106,465; 4,596,763; and 4,588,670, all incorporated herein by reference.

The polymer binders most frequently used for positive-working photoresists in conjunction with o-quinone diazides are the alkali soluble phenol formaldehyde resins known as the novolak resins. Photoresists using such polymers are illustrated in U.S. Pat. Nos. 4,377,631 and 4,404,272. Another class of binders used with o-quinone diazides are homopolymers and copolymers of vinyl phenol. Photoresists of this nature are disclosed in U.S. Pat. No. 3,869,292.

Negative-working resists may also be treated in accordance with the invention and are well known in the art. Such photoresists typically undergo random cross-linking upon exposure to activating radiation thereby forming areas of differential solubility. Such resists often comprise a polymer and a photoinitiator. One class of negative-working resists comprise, for example, polyvinyl cinnamates as disclosed by R. F. Kelly, *Proc. Second Kodak Semin. Micro Miniaturization*, Kodak Publication P-89, 1966, p. 31. Other negative-acting resists include polyvinylcannamylidene acetates as disclosed in U.S. Pat. No. 2,716,102; azide cyclized rubber as disclosed in U.S. Pat. No. 2,940,853; polymethyl methacrylate tetraacrylate as disclosed in U.S. Pat. No. 3,149,975; polyimide-methyl methacrylate as disclosed in U.S. Pat. No. 4,180,404; and polyvinyl phenol azide as disclosed in U.S. Pat. No. 4,148,655.

Another class of photoresists for purposes of the invention are those positive and negative acid-hardening resists disclosed in EPO application Serial No. 0 232 972 in the name of Feely et al. These photoresists comprise an acid-hardening resin and a halogenated, organic, photoacid generating compound.

Substantially all components of the photoresist composition are a source of multivalent metal ions such as iron., copper, chromium, nickel, molybdenum and zinc. In accordance with the invention, the multivalent metal ions in any one or more components of the photoresist composition are chelated with a chelating agent and a liquid solution of that component or components is contacted with a high purity activated carbon adsorbent.

The multivalent metal ions arc chelated prior to contact with the activated carbon. Many of the above-described photoresists contain impurities that are chelating agents for the metallic ions. For example, o-.quinone diazide acid esters and diazide photoactive compounds are known to contain dyes such as azo dyes, diazo dyes and azides that function as chelating agents for multivalent metal ions. A representative structure for one class of dye impurities found in o-quinone diazide based photoresists is as follows:

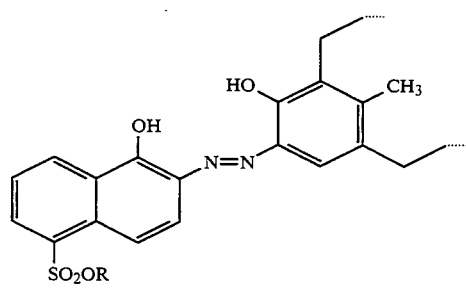

Chelation of a multivalent ion with the above structure is believed to take place through the hydroxyl groups with one of the nitrogens in the diazide contributing an electron pair.

If the composition to be purified contains a chelating agent for the multivalent metal ions as an impurity, a chelating agent need not be added though an additional one or more chelating agents may be added to enhance chelation of the multivalent metal ions if desired.

If the material to be purified does not contain a chelating agent, then a chelating agent may be mixed into the photoresist solution or the solution of the photoresist component to chelate the multivalent metal ions. Preferred chelating agents that may be added to solution are azo and diazo dyes of the type shown above, especially indicators for metal ions. Examples of such materials may be found in Green, *The Sigma-Aldrich Handbook of Stains, Dyes and Indicators*, Aldrich Chemical Company, Inc., Milwaukee, Wis., 1990, incorporated herein for its showing of materials suitable for chelation with metal ions. Preferred materials include acid Blue 92 (formed by coupling diazotized H acid (8-amino-1-naphthol-3,6-disulfonic acid) with N-phenyl-1-naphthylamine-8-sulfonic acid, Palatine Chrome Black 6BN made by coupling diazotized 1,2,4-acid (1-amino-2-naphthol-4-sulfonic acid) to 2-naphthol, and Plasmocorinth B. Other lesser preferred chelating agents that may be added include polyfunctional acids which have, in addition to polar groups, active hydrogen or electron donors such as carboxyl, hydroxyl, oxo, amino or .ester groups and thus have enhanced complexing properties. Such acids include, by way of example, oxalic acid, malonic acid, succinic acid or an unsaturated acid such as maleic acid. Similar complexing action is also exhibited by keto-carboxylic acids such as, for example, glycolic acid and lactic acid or, of the aromatic compounds, salicylic acid.

The amount of chelating agent in the solution of the photoresist components to be purified is that amount required to complex essentially all of the multivalent metal ions present in solution. Typically, the amount of metal ions is low, for example, about 500 parts per billion parts of solution (ppb) prior to purification. Consequently, a small concentration of complexing agent is satisfactory provided the amount is at least about equimolar with the multifunctional metal ions. Preferably, the molar ratio of complexing agent to multivalent metal ion varies between about 10:1 and 1:1, and more preferably, between 5:1 and 2:1.

The method of contact of the solution of the photoresist components with the activated carbon is not critical and methods known to the art are suitable. For example, contact may be by slurrying the photoresist solution with the activated carbon or by passing the solution of the photoresist component through a fixed bed or column of the activated carbon. Contact time is that time necessary to remove essentially all of the metal ions and may vary from several minutes up to 24 hours and more preferably varies between 1 and 5 hours. If contact is through a fixed bed, then from about 2 to 10 bed volumes may be passed through the bed per hour. Contact may be at ambient conditions.

The activated carbon used for purification should be a high purity activated carbon and should be essentially free of metal contamination. Otherwise, contact between the activated carbon and the solution of the photoresist components could introduce metal ions into solution rather than remove the same. In general, the activated carbon contains metal ions in an amount of less than 1 ppm, preferably less than 200 ppb and most preferably, less than 50 ppb. The activated carbon is porous and in granular form and has not already absorbed its capacity of organic materials and metal ions. Preferably, the activated carbon has an average particle size of between about 10 and about 200 microns and an effective surface area of from about 500 to 5,000 square meters per gram.

In the most preferred embodiment of the invention, the activated carbon is the product resulting from pyrolysis of a carbon-based cation exchange resin. The pyrolysis of cation exchange resins to form activated carbon adsorbents is known in the art and disclosed in the literature, for example, in U.S. Pat. Nos. 4,342,839; 4,839,331; 4,957,897; 5,094,754; and 5,217,505, each incorporated herein by reference for the teaching of methods for making activated carbon and as exemplary of the materials contemplated for purposes of the preferred embodiment of the invention. Most preferred are activated carbons formed by the pyrolysis of macroporous poly(vinyl aromatic) resins. The pyrolyzed cation exchange resins are preferred because it is believed that following pyrolysis, the activated carbon retains cation exchange groups which enhances the removal of metal ions from solution.

EXAMPLE 1

Five grams of a diazonaphthoquinone diazide photoactive compound consisting of mixed esters formed by reaction of 2,1,5-diazonaphthoquinone diazide sulfonic acid and trihydroxybenzophenone (THBP) were dissolved in 100 ml of ethyl lactate. The solution contained iron ions in an amount of 700 ppb. The solution was passed through a column packed with 100 grams of Norit A activated carbon at a rate of about 8 bed volumes per hour. The solution was then analyzed by high pressure liquid chromatography to detect organic impurities and (graphite furnace) atomic absorption spectroscopy to detect iron ions. Organic impurities were removed to the limit of detection. The analysis for iron revealed a decrease of from 700 ppb to 60 ppb.

EXAMPLE 2

The procedure of Example 1 was repeated using a 150 ml sample of S1400 ® photoresist available from Shipley Company Inc. of Marlborough, Mass. which consists of a naphthoquinone diazide sulfonic acid and a novolak resin dissolved in a solvent. The solution was treated by passing the same through a column containing 100 grams of AMBERSORB ® 572 activated carbon adsorbent. Prior to carbon treatment, the resist contained 120 ppb of iron. Following carbon treatment, over 60% of the iron species had been removed. Subsequent passes through the column improved the purification of the resist and ultimately gave an iron concentration of 10 ppb.

We claim:

1. A process for the removal of multivalent metal ions from an organic solution, said process comprising the steps of providing an organic solution containing chelated multivalent metal ions dissolved in solution and contact of said solution containing said dissolved chelated multivalent ions with granulated activated carbon for a time sufficient to substantially reduce the multivalent metal ion content of said solution.

2. The process of claim 1 where the chelating agent used to chelate the multivalent ions is present in the organic solution as an impurity.

3. The process of claim 1 where the chelating agent used to chelate the multivalent ions is added to solution prior to contact with the activated carbon.

4. The process of claim 3 where the chelating agent added to the solution is a member selected from the group consisting of azo dyes, diazo dyes and organic acids.

5. The process of claim 3 where the chelating agent is an indicator dye.

6. The process of claim 3 where the chelating agent added to solution is in an amount at least equimolar with the multivalent metal ions.

7. The process of claim 6 where the multivalent metal ions in solution do not exceed 500 parts per million parts of solution and the chelating agent is used in an amount of from 2 to 10 moles per mole of the multivalent metal ions.

8. The process of claim 7 where the chelating agent is used in an amount of from 2 to 5 moles per mole of the multivalent metal ions.

9. The process of claim 1 where the activated carbon used contains metal ions in an amount not exceeding 1 part per million parts of the activated carbon.

10. The process of claim 9 where the metal ion content does not exceed 100 parts per billion parts of carbon.

11. The process of claim 1 where the activated carbon is a pyrolyzed cation exchange resin.

12. A process for the removal of multivalent metal ions from one or more components of a photoresist solution, said process comprising the steps of providing a solution of one or more photoresist components containing chelated multivalent metal ions dissolved in the solution and contact of said solution containing said dissolved chelated multivalent ions with granulated activated carbon for a time sufficient to substantially reduce the multivalent metal ion content of said solution.

13. The process of claim 12 where the photoresist solution is one containing an o-quinone diazide acid ester photoactive compound and the chelating agent used to form the chelated multivalent ions is an impurity from said o-quinone diazide acid ester.

14. The process of claim 12 where the chelating agent used to form the chelated multivalent ions is added to solution prior to contact with the activated carbon.

15. The process of claim 14 where the chelating agent added to the solution is a member selected from the group consisting of azo dyes, diazo dyes and organic acids.

16. The process of claim 12 where the photoresist solution is one containing an o-quinone diazide sulfonic acid ester and an alkali soluble phenolic resin.

17. The process of claim 16 where the multivalent ions are chelated with an azo or diazo dye.

18. The process of claim 12 where the activated carbon used contains metal ions in an amount not exceeding 1 part per million parts of the activated carbon.

19. The process of claim 18 where the metal ion content does not exceed 100 parts per billion parts of carbon.

20. The process of claim 12 where the activated carbon is a pyrolyzed cation exchange resin.

* * * * *